US009257668B2

(12) United States Patent
Choi

(10) Patent No.: US 9,257,668 B2

(45) Date of Patent: Feb. 9, 2016

(54) ORGANIC LIGHT-EMITTING DIODE (OLED) DISPLAY AND METHOD FOR MANUFACTURING THE SAME

(71) Applicant: Samsung Display Co., Ltd., Yongin-si, Gyeonggi-do (KR)

(72) Inventor: Jun-Won Choi, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/218,493

(22) Filed: Mar. 18, 2014

(65) Prior Publication Data

US 2015/0084498 A1 Mar. 26, 2015

(30) Foreign Application Priority Data

Sep. 23, 2013 (KR) ........................ 10-2013-0112865

(51) Int. Cl.
*H05B 33/04* (2006.01)
*H01L 51/52* (2006.01)

(52) U.S. Cl.
CPC .................................. *H01L 51/5246* (2013.01)

(58) Field of Classification Search
CPC ........................ H01L 51/5246; H01L 51/5243
USPC ............ 313/498–512; 315/169.3; 345/36, 45, 345/76
See application file for complete search history.

(56) References Cited

U.S. PATENT DOCUMENTS

| | | | | |
|---|---|---|---|---|
| 6,566,808 | B1 * | 5/2003 | Duggal et al. | 313/512 |
| 2002/0070382 | A1 * | 6/2002 | Yamazaki et al. | 257/72 |
| 2002/0180342 | A1 * | 12/2002 | Yamada et al. | 313/493 |
| 2003/0062829 | A1 * | 4/2003 | Heimgartner et al. | 313/506 |
| 2003/0094615 | A1 * | 5/2003 | Yamazaki et al. | 257/72 |
| 2007/0284761 | A1 * | 12/2007 | Morooka et al. | 257/792 |
| 2010/0117525 | A1 * | 5/2010 | Warashina et al. | 313/504 |
| 2012/0080671 | A1 | 4/2012 | Niboshi et al. | |
| 2012/0104933 | A1 | 5/2012 | Jung et al. | |
| 2012/0131959 | A1 | 5/2012 | No et al. | |
| 2012/0319574 | A1 | 12/2012 | Kim et al. | |
| 2013/0049062 | A1 | 2/2013 | Hatano et al. | |

FOREIGN PATENT DOCUMENTS

| | | | |
|---|---|---|---|
| KR | 10-2001-0084380 | A | 9/2001 |
| KR | 10-0978636 | B1 | 8/2010 |
| KR | 10-2011-0054504 | A | 5/2011 |
| KR | 10-2012-0044020 | A | 5/2012 |
| KR | 10-2012-0139075 | A | 12/2012 |
| KR | 10-2013-0023099 | A | 3/2013 |
| WO | WO 2010/143337 | A1 | 12/2010 |

* cited by examiner

*Primary Examiner* — Nimeshkumar Patel
*Assistant Examiner* — Christopher Raabe
(74) *Attorney, Agent, or Firm* — Knobbe, Martens, Olson & Bear, LLP

(57) ABSTRACT

An organic light-emitting diode (OLED) display is disclosed. In one aspect, the OLED display includes a first substrate including a display area and a second substrate facing the first substrate. The OLED display also includes a sealing member surrounding the display area and attaching the first and second substrates to each other and a gold layer formed on the sealing member.

22 Claims, 5 Drawing Sheets

ORGANIC LIGHT-EMITTING DIODE (OLED) DISPLAY AND METHOD FOR MANUFACTURING THE SAME

CROSS-REFERENCE TO RELATED APPLICATIONS

This application claims the benefit of Korean Patent Application No. 10-2013-0112865, filed on Sep. 23, 2013, in the Korean Intellectual Property Office, the disclosure of which is incorporated herein in its entirety by reference.

BACKGROUND

1. Field

The described technology generally relates to an organic light-emitting diode (OLED) display and a method of manufacturing the same.

2. Description of the Related Technology

Displays are used to provide visual information, such as images or video, to a user. These displays can be manufactured to have various different shapes.

Organic light-emitting diode (OLED) displays are self-emissive displays that emit light by electrically exciting an organic compound. OLED displays are receiving attention as next generation displays due to their favorable characteristics such as low driving voltages, their profile, wide viewing angles, and fast response speeds.

SUMMARY OF CERTAIN INVENTIVE ASPECTS

One inventive aspect is an OLED display and a method of manufacturing the same wherein the dead space occupied by a sealing member is reduced.

Another aspect is an OLED display and a method of manufacturing the same wherein the adhesive strength of the sealing member is increased and oxidation or volatilization of the sealing member is substantially prevented.

Another aspect is an OLED display including a first substrate including a display area, a second substrate facing the first substrate, a sealing member surrounding the display area and attaching the first and second substrates to each other, and a gold layer formed on the sealing member.

At least a portion of the sealing member may be formed on an insulating layer. The gold layer may be formed the insulating layer.

The width of the sealing member may be about 680 μm.

The sealing member may include glass frit.

The gold layer may include at least one of a first gold layer formed on an inner side of the sealing member and a second gold layer formed on an outer side of the sealing member.

The first substrate may further include a peripheral area surrounding the display area and an insulating layer formed on the first substrate throughout the display area and the peripheral area and defining at least one first through hole in the peripheral area.

The sealing member may fill the first through hole.

The gold layer may be formed on the insulating layer.

The display area may include a buffer layer, a gate insulating film, and an interlayer insulating layer and the insulating layer may include at least one of the buffer layer, the gate insulating film, or the interlayer insulating layer.

A metal layer may be formed on the first substrate and define at least one second through hole.

The first through hole may be formed within the area of the second through hole.

At least a portion of the insulating layer may be formed between the metal layer and the sealing member.

The OLED display may further include a transistor including a gate electrode and the metal layer may be formed of the same material as the gate electrode.

The metal layer may be formed on the same layer as the gate electrode.

An additional insulating layer may be further formed between the first substrate and the insulating layer.

Another aspect is a method of manufacturing an OLED display, including preparing a first substrate including a display area and a peripheral area surrounding the display area, forming a sealing member on the peripheral area of the first substrate, forming a gold layer on the sealing member, and attaching a second substrate to the first substrate with the sealing member.

The gold layer may be formed on at least one of an inner side and an outer side of the sealing member.

The preparing of the first substrate may include forming an insulating layer on the first substrate throughout the display area and the peripheral area and defining at least one first through hole in the peripheral area and the sealing member may be formed to fill the first through hole.

The gold layer may be formed on the insulating layer.

The preparing of the first substrate may further include forming a metal layer having at least one second through hole in the metal layer. The first through hole may be formed within the area of the second through hole.

Another aspect is an organic light-emitting diode (OLED) display including first and second substrates spaced apart and opposing each other, an insulating layer formed over the first substrate, wherein the insulating layer defines a first area which is surrounded by a portion of the insulating area and wherein the insulating layer is not formed in the first area, and a sealing member formed over the first substrate and filling the first area, wherein the sealing member attaches the first substrate to the second substrate.

The OLED display further includes a metal layer formed over the first substrate and defining a second area which is surrounded by a portion of the metal layer, wherein the metal layer and the insulating layer are not formed in at least a part of the second area and wherein the first area is formed within the second area. At least one of the first or second areas includes a plurality of sub-areas which are spaced apart from each other.

DETAILED DESCRIPTION OF CERTAIN INVENTIVE EMBODIMENTS

Figure 1:
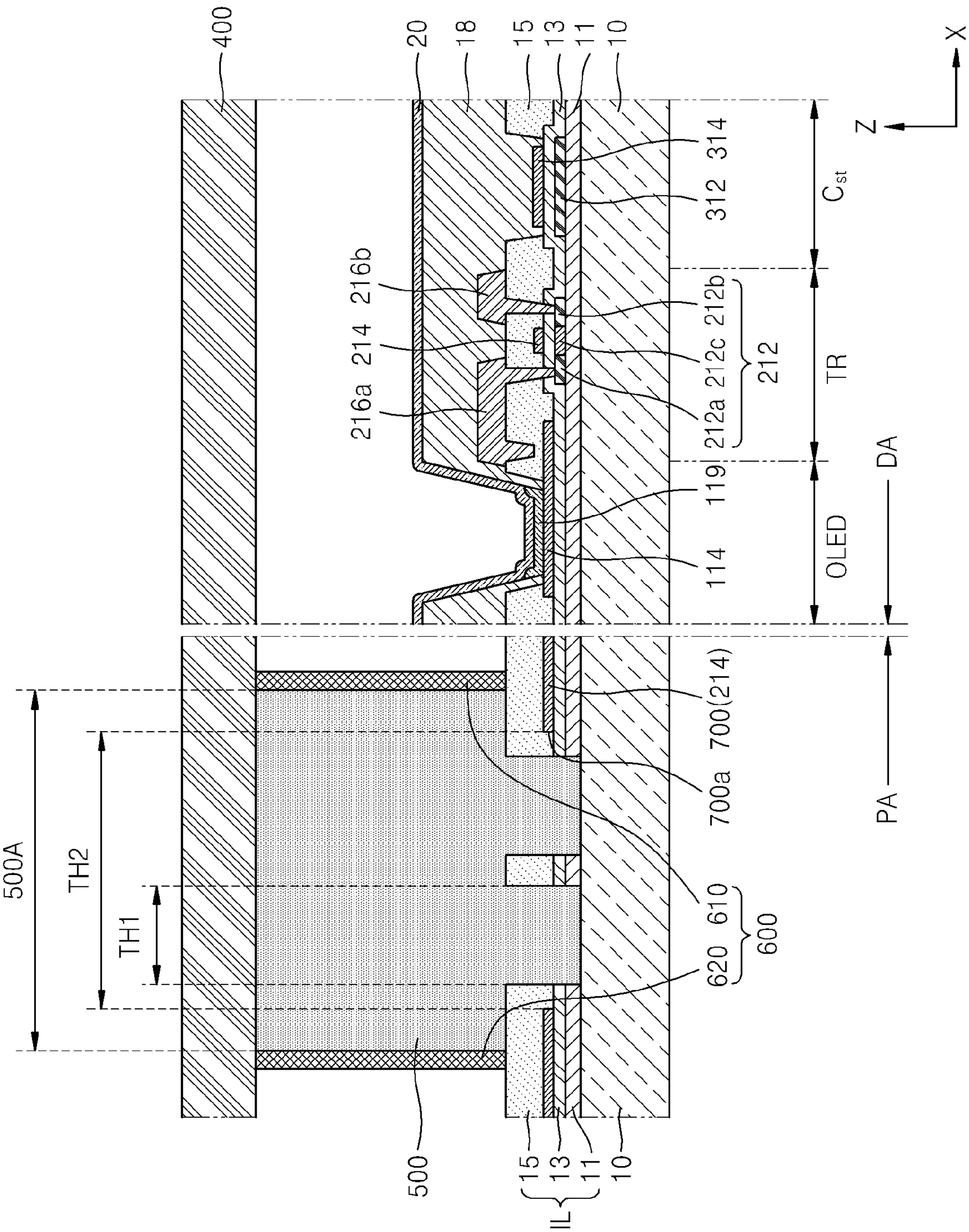
FIG. 1 a cross-sectional view schematically illustrating a portion of an OLED display according to an embodiment.

A sealing member can be used to assemble the upper and lower substrates of an OLED display. The region occupied by the sealing member is a dead space where no image is displayed, and thus, it is desirable to reduce the area in which it occupies.

The adhesive strength between a sealing member and a substrate is related to the overall contact area. In the standard OLED display, the sealing member occupies a large area due to the adhesive strength that is required to maintain the integrity of the two substrates as a unit.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the described technology. Sizes of elements in the drawings may be exaggerated for convenience of explanation. In other words, since the sizes and thicknesses of components in the drawings may be exaggerated for convenience of explanation, the following embodiments are not limited thereto.

In the following examples, the x-axis, the y-axis and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

It will be understood that although the terms "first", "second", etc. may be used herein to describe various components, these components should not be limited by these terms. These components are only used to distinguish one component from another.

Terms used herein are used to describe one or more embodiments of the described technology and are not intended to limit the scope of the described technology. As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for, example, intervening layers, regions, or components may also be present.

As used herein, the term "and/or" includes any and all combinations of one or more of the associated listed items. Expressions such as "at least one of," when preceding a list of elements, modify the entire list of elements and do not modify the individual elements of the list.

FIG. 1 a cross-sectional view schematically illustrating a part of an organic light-emitting diode (OLED) display according to an embodiment. As shown in FIG. 1, the OLED display includes a first substrate 10 including a display area DA and a peripheral area PA, a second substrate 400 facing the first substrate 10, and a sealing member 500 attaching the first substrate 10 to the second substrate 400.

The first substrate 10 is divided into the display area DA and the peripheral area PA surrounding the display area DA. The first substrate 10 may be formed of a transparent glass material including silicon dioxide ($SiO_2$). The material of the first substrate 10 is not limited thereto and may be a transparent plastic material. The first substrate 10 may be a flexible substrate. In these cases, the flexible substrate may be formed of a polymer material such as a flexible plastic film that has low specific gravity which is light-weight compared to a glass substrate, is not breakable, and is bendable.

A buffer layer 11 is further disposed on the first substrate 10. The buffer layer 11 may be formed of an inorganic material, such as silicon oxide ($SiO_X$), silicon nitride ($SiN_X$), silicon oxynitride (SiON), aluminum oxide (AlO), or aluminum oxynitride (AlON), or an organic material, such as acryl or polyimide, or may be formed by alternately stacking an organic material and an inorganic material. The buffer layer 11 blocks oxygen and moisture and prevents diffusion of moisture or impurities from the first substrate 10 to the pixels of the OLED display. The buffer layer 11 also has an effect on heat transfer speed during crystallization of silicon so that a semiconductor can be satisfactorily crystallized.

The second substrate 400 faces the first substrate 10 and may be formed of any one of various materials, such as a glass material, a metal material, or a plastic material. The first and second substrates 10 and 400 may be attached to each other with the sealing member 500.

Furthermore, the display area DA includes a transistor TR that is a driving thin-film transistor (TFT), a capacitor Cst, and an OLED. The transistor TR is disposed on the buffer layer 11. In the current embodiment, the TFT is a bottom gate type TFT, but according to other embodiments, the TFT is a top gate type TFT.

An active layer 212 is disposed on the buffer layer 11. According to some embodiments, the active layer 212 is formed of polysilicon which is formed by crystallizing amorphous silicon.

The amorphous silicon may be crystallized by using any one of various methods, such as a rapid thermal annealing (RTA) method, a solid phase crystallization (SPC) method, an excimer laser annealing (ELA) method, a metal induced crystallization (MIC) method, a metal induced lateral crystallization (MILC) method, or a sequential lateral solidification (SLS) method. According to some embodiments, a method that does not require a high temperature heating process is used to crystallize the amorphous silicon.

For example, during crystallization using a low temperature polysilicon (LTPS) process, the active layer 212 may be activated by irradiating a laser beam for a short period of time so as to prevent the first substrate 10 from being exposed to a high temperature of about 300° C. or greater. Consequently, the entire process may be performed at a temperature less than about 300° C. Accordingly, the transistor TR may be formed on a substrate formed of a polymer material.

The active layer 212 includes a source region 212*b* and a drain region 212*a* formed by doping N- or P-type impurity ions. A channel region 212*c* in which impurities are not doped is disposed between the source and drain regions 212*b* and 212*a*.

A gate insulating film 13 is disposed on the active layer 212. The gate insulating film 13 may have a single layer structure formed of $SiO_2$, or a double layer structure formed of $SiO_2$ and $SiN_X$.

A gate electrode 214 is disposed in a predetermined region on the gate insulating film 13. The gate electrode 214 is connected to a gate line (not shown) for applying a transistor on/off signal. The gate electrode 214 may be formed of a single or multiple conductive layers.

A drain electrode 216*a* and a source electrode 216*b* are respectively connected to the drain and source regions 212*a* and 212*b* of the active layer 212 and are disposed over the gate electrode 214 with an interlayer insulating layer 15 interposed therebetween. The interlayer insulating layer 15 may be formed of an electrically insulating material, such as $SiO_2$ or $SiN_X$, or an electrically insulating organic material.

A pixel-defining film (or pixel defining layer) 18 is disposed on the interlayer insulating layer 15 to cover the drain and source electrodes 216*a* and 216*b*. Also, a pixel electrode 114 formed of the same transparent conductive material as the gate electrode 214 may be disposed on the buffer layer 11 and the gate insulating film 13. The resistances of the drain and source electrodes 216*a* and 216*b* may be lower than resistance of the gate electrode 214.

The pixel electrode 114 may be formed by depositing a metal having a low work function, such as lithium (Li), calcium (Ca), lithium fluoride (LiF)/Ca, LiF/aluminum (Al), Al, magnesium (Mg), or a compound thereof on the gate insulating film 13, and then forming an auxiliary electrode formed of a transparent electrode forming material, such as indium tin oxide (ITO), indium zinc oxide (IZO), ZnO, or indium oxide ($In_3O_3$), thereon. However, the pixel electrode 114 is not limited thereto, and may be a reflective electrode.

An intermediate layer 119 is formed on the pixel electrode 14 by etching a part of the pixel-defining film 18. The intermediate layer 119 includes at least an organic light-emitting layer in order to emit visible light.

A counter electrode (or opposite electrode) 20 that is a common electrode is disposed on the intermediate layer 119. Voltages having different polarities are applied to the intermediate layer 119 so that the intermediate layer 119 emits a light.

An organic emission layer of the intermediate layer 119 may be formed of a low molecular organic material or a high molecular organic material.

When the organic emission layer of the intermediate layer 119 is formed of a low molecular organic material, the intermediate layer 119 may have a single or complex structure including a hole injection layer (HIL), a hole transport layer (HTL), an electron transport layer (ETL), and an electron injection layer (EIL), in addition to the organic emission layer.

Examples of an organic material usable in the intermediate layer 119 include copper phthalocyanine (CuPC), N, N'-di (naphthalene-1-yl)-N, N'-diphenyl-benzidine (NPB), and tris-8-hydroxyquinoline aluminum ($Alq_3$). The low molecular organic material may be formed via a vacuum deposition method using masks.

When the organic emission layer of the intermediate layer 119 is formed of a high molecular organic material, the intermediate layer 119 may include an HTL and the organic emission layer. Here, the HTL may be formed of poly(3,4-ethylenedioxythiophene (PEDOT), and the organic emission layer may be formed of a poly-phenylenevinylene (PPV)-based or polyfluorene-based high molecular organic material. The high molecular organic material may be formed via a screen printing method or an inkjet printing method. However, the intermediate layer 119 is not limited thereto.

Like the pixel electrode 114, the counter electrode 20 may be a transparent electrode or a reflective electrode. In the case that the counter electrode 20 is a transparent electrode, the counter electrode 20 may be formed by depositing a metal having a low work function, such as Li, Ca, LiF/Ca, LiF/Al, Al, Mg, or a compound thereof, on the intermediate layer 119, and then forming an auxiliary electrode formed of a transparent electrode forming material, such as ITO, IZO, ZnO, or In2O3, thereon.

In the case that the counter electrode 20 is a reflective electrode, the counter electrode 20 may be formed by depositing Li, Ca, LiF/Ca, LiF/Al, Al, Mg, or a compound thereof.

The shape of the pixel electrode 114 may correspond to the opening shape of each sub-pixel. The counter electrode 20 may be formed by depositing a transparent electrode or a reflective electrode throughout the display area DA. Alternatively, the counter electrode 20 may not be formed throughout the display area DA but may be patterned in any shape. Here, the positions of the pixel electrode 114 and the counter electrode 20 may be switched.

In the OLED display according to the current embodiment, the pixel electrode 114 is used as an anode and the counter electrode 20 is used as a cathode, or vice versa.

The buffer layer 11, the gate insulating film 13, and the interlayer insulating layer 15 may be referred to as an insulating layer IL. The insulating layer IL may be disposed throughout the display area DA and the peripheral area PA of the first substrate 10 as shown in FIG. 1. Also, the insulating layer IL may include at least one first through hole TH1 in the peripheral area PA.

The sealing member 500 attaches the first and second substrates 10 and 400 to each other and fills the first through hole TH1. The sealing member 500 may include glass frit.

In order for the sealing member 500 to have a sufficient adhesive strength for attaching the first and second substrates 10 and 400 to each other, the sealing member must have a sufficient contact area with each of the first and second substrates 10 and 400. However, as the width 500A occupied by the sealing member 500 increases, the area of the peripheral area PA, that is a dead space, also increases. Thus, in order to reduce the dead space, the width 500A, i.e., the area occupied by the sealing member 500 may be reduced.

The OLED display according to the current embodiment further includes a gold (Au) layer 600 contacting the sealing member 500 so as to reduce the dead space. According to some embodiments, the gold layer 600 includes a first gold layer 610 formed on the inner side of the sealing member 500 and a second gold layer 620 formed on the outer side of the sealing member 500. The first and second gold layers 610 and 620 are shown in FIG. 1, but the structure of the gold layer 600 is not limited thereto. In other words, the gold layer 600 may only include either the first gold layer 610 or the second gold layer 620. The gold layer 600 may be disposed on the same layer as a portion of the sealing member 500 formed on the first substrate 10. For example, the edge of the sealing member 500 may be disposed on the insulating layer IL and the gold layer 600 may contact the sealing member 500 on the insulating layer IL.

Since the gold layer 600 has high ductility, the gold layer 600 has excellent adhesion with the sealing member 500 formed of glass fit. For example, during a laser process, the volume of the gold layer 600 is increased to contact the sealing member 500 while filling the space between the gold layer 600 and the sealing member 500. Also, since gold is not naturally oxidized and the gold layer 60 blocks the sealing member 500 from being exposed to the external environment, the sealing member 500 is prevent from oxidizing or volatizing. As such, by including the gold layer 600, the area of sealing member 500 may be reduced, and thus, a dead space may also be reduced. For example, width of the sealing member 500 may be equal to or less than about 680 μm.

Furthermore, the insulating layer IL may include the at least one first through hole TH1. Accordingly, the area of the sealing member 500 on a plane (XY plane) parallel to the first substrate 10 may be decreased while the contact area between the sealing member 500 and the layers formed on the first substrate 10, i.e., the insulating layer IL, may be increased. Accordingly, the area occupied by the sealing member 500, i.e., the width thereof, may be reduced, reducing dead space while maintaining or reinforcing the adhesive force between the sealing member 500 and the first substrate 10.

Additionally, as shown in FIG. 1, the OLED display may include a metal layer 700 having at least one second through hole HT2 and disposed between the first substrate 10 and the insulating layer IL. As described above, the display area DA includes a TFT including the gate electrode 214. The metal layer 700 may be formed of the same material as the gate electrode 214 of the TFT. Further, the metal layer 700 may be disposed on the same layer as the gate electrode 214. For example, the metal layer 700 may extend from the gate electrode 214.

In FIG. 1, the metal layer 700 is disposed on the gate insulating film 13 like the gate electrode 214. Alternatively, the metal layer 700 may be formed of the same material and on the same layer as the drain or source electrodes 216*a* or 216*b* of the TFT. For convenience of description, it is assumed that the metal layer 700 is formed of the same material and on the same layer as the gate electrode 214.

The sealing member 500 may be hardened by irradiating an ultraviolet (UV) light or a laser beam to attach the first and second substrates 10 and 400 to each other. The UV light or the laser beam may be irradiated on the sealing member 500 through the second substrate 400, and at this time, the irradiating efficiency of the UV light or the laser beam may be increased by reflecting the UV light or the laser beam that reached the sealing member 500 off of the metal layer 700 below the sealing member 500 so that the light can be transmitted again to the sealing member 500.

The area of the sealing member 500 contacting the second substrate 400 may be easily observed through the second substrate 400 which is formed of a transparent material, but the area of the sealing member 500 contacting the first substrate 10 cannot be observed since the metal layer 700 is not transparent. Thus, the sealing member 500 includes at least one second through hole TH2 so that the sealing member 500 can be seen through the second through hole TH2 of the metal layer 700. Accordingly, the area of the sealing member 500 contacting the first substrate 10 can be observed through the second through hole TH2. As such, the areas of the sealing member 500 contacting each of the first and second substrates 10 and 400 can be measured against a predetermined value to ensure sufficient contact area for sealing strength.

The inner surface 700*a* of each second through hole TH2 is covered by the insulating layer IL and does not contact the sealing member 500. In FIG. 1, the metal layer 700 is covered by the interlayer insulating layer 15, and thus, the inner surface 700*a* of the second through hole TH2 of the metal layer 700 does not contact the sealing member 500.

The first through hole TH1 may be formed inside the second through hole TH2. For example, while forming the first through hole TH1 in the insulating layer IL, each of the buffer layer 11, the gate insulating film 13, and the interlayer insulating layer 15 may be simultaneously etched to form the at least one first through hole TH1. After the inner surface 700*a* of the second through hole TH2 is exposed by the first through hole TH1, the metal layer 700 additionally etched to form the second through hole TH2, increasing the area thereof. Accordingly, the inner surface 700*a* of the second through hole TH2 may be covered by the insulating layer IL and not contact the sealing member 500.

Figure 2:
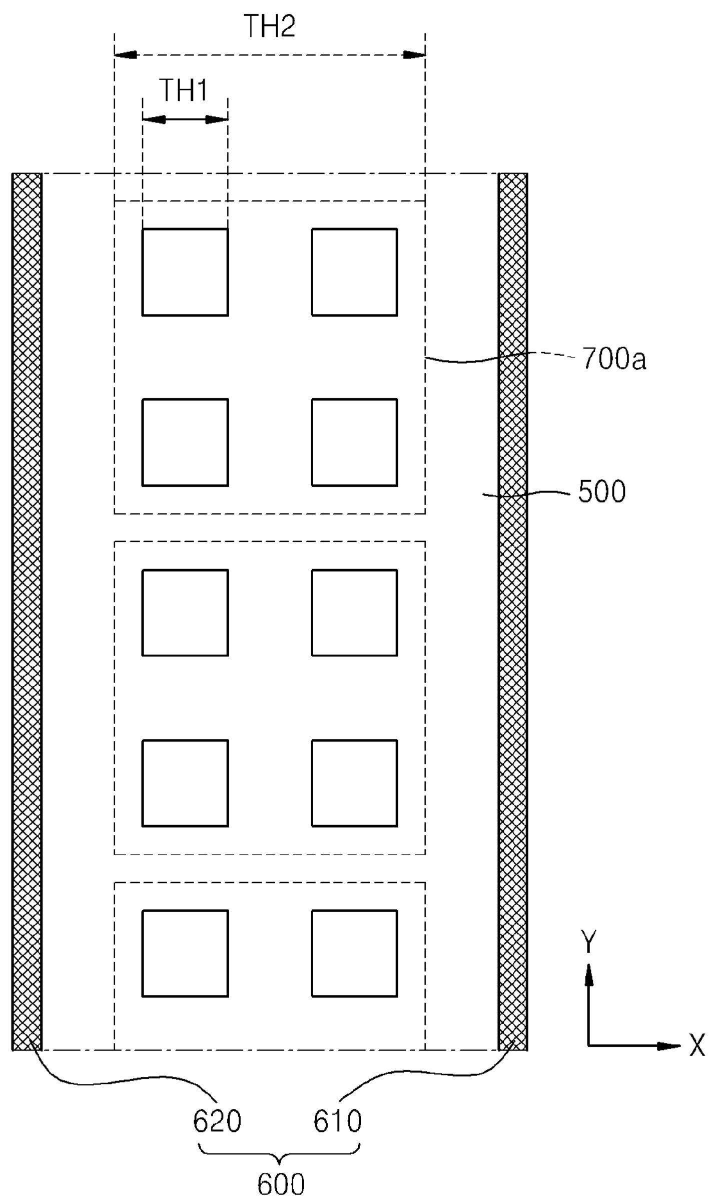
FIG. 2 is a plan view schematically illustrating the peripheral area of the OLED display of FIG. 1 according to an embodiment.

FIG. 2 is a plan view schematically illustrating the peripheral area PA of the OLED display of FIG. 1 according to an embodiment. FIG. 2 illustrates the sealing member 500 and the gold layer 600 contacting the sealing member 500, wherein the first through hole TH1 is shown in a solid line and the second through hole TH2 is shown in a broken line.

As shown in FIG. 2, the insulating layer IL of the OLED display according to the current embodiment includes the first through hole TH1. Here, one or more first through holes TH1 may form a group to form a set of first through holes. The first through holes TH1 in the first through hole set may overlap a corresponding second through hole TH2. In other words, the first through hole set may be disposed inside the corresponding second through hole TH2. In FIG. 2, for example, four first through holes TH1 overlap the second through hole TH2.

The distance between the first through holes TH1 may be about 2.5 μm or greater. When the distance between first through holes TH1 is less than about 2.5 μm, the insulating layer IL between adjacent first through holes TH1 may be broken to connect the adjacent through holes TH1. In this case, the contact area between the sealing member 500 and the insulating layer IL may be reduced. Here, the distance between the first through holes TH1 is not the distance between the centers of the first through holes TH1, but refers to the thickness of the insulating layer IL between the adjacent first through holes TH1.

Figure 3:
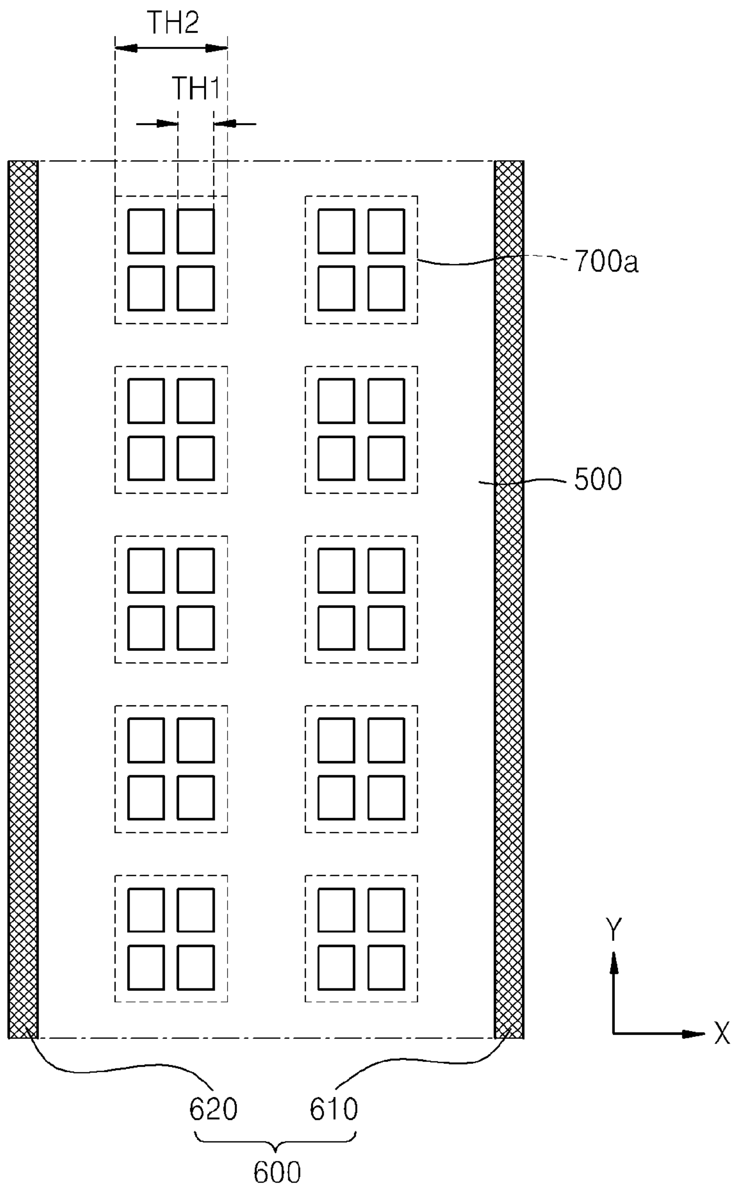
FIG. 3 is a plan view schematically illustrating the peripheral area of the OLED display of FIG. 1 according to another embodiment.

FIG. 3 is a plan view schematically illustrating the peripheral area PA of the OLED display of FIG. 1, according to another embodiment. As shown in FIG. 3, the metal layer 700 may include a plurality of second through holes TH2 in the width direction of the sealing member 500. As described above, the contact area between the sealing member 500 and the first substrate 10 may be measured if the sealing member 500 is observable through the second through holes TH2 of the metal layer 700 from the first substrate 10.

Each of the first through holes TH1 may be disposed in a corresponding second through hole TH2. By extending the first through hole TH1 to the buffer layer 11 immediately above the first substrate 10 through the second through hole TH2, the sealing member 500 directly contacts the first substrate 10, thereby improving the adhesive force between the sealing member and the first substrate 10.

Meanwhile, as described above, the inner surface 700*a* of the second through hole TH2 is covered by the insulating layer IL, and thus does not contact the sealing member 500. Accordingly, as shown in FIGS. 2 and 3, the area of the first through hole TH1 may be smaller than the area of the corresponding second through hole TH2.

In FIG. 1, the insulating layer IL is illustrated as including the buffer layer 11, the gate insulating film 13, and the interlayer insulating layer 15, however, the structure of the insulating layer IL is not limited thereto. Another insulating layer in the display area DA may extend up to the peripheral area PA to become included in the insulating layer IL, and in this case, the other insulating layer includes at least one first through hole TH1 in the peripheral area PA.

Figure 4:
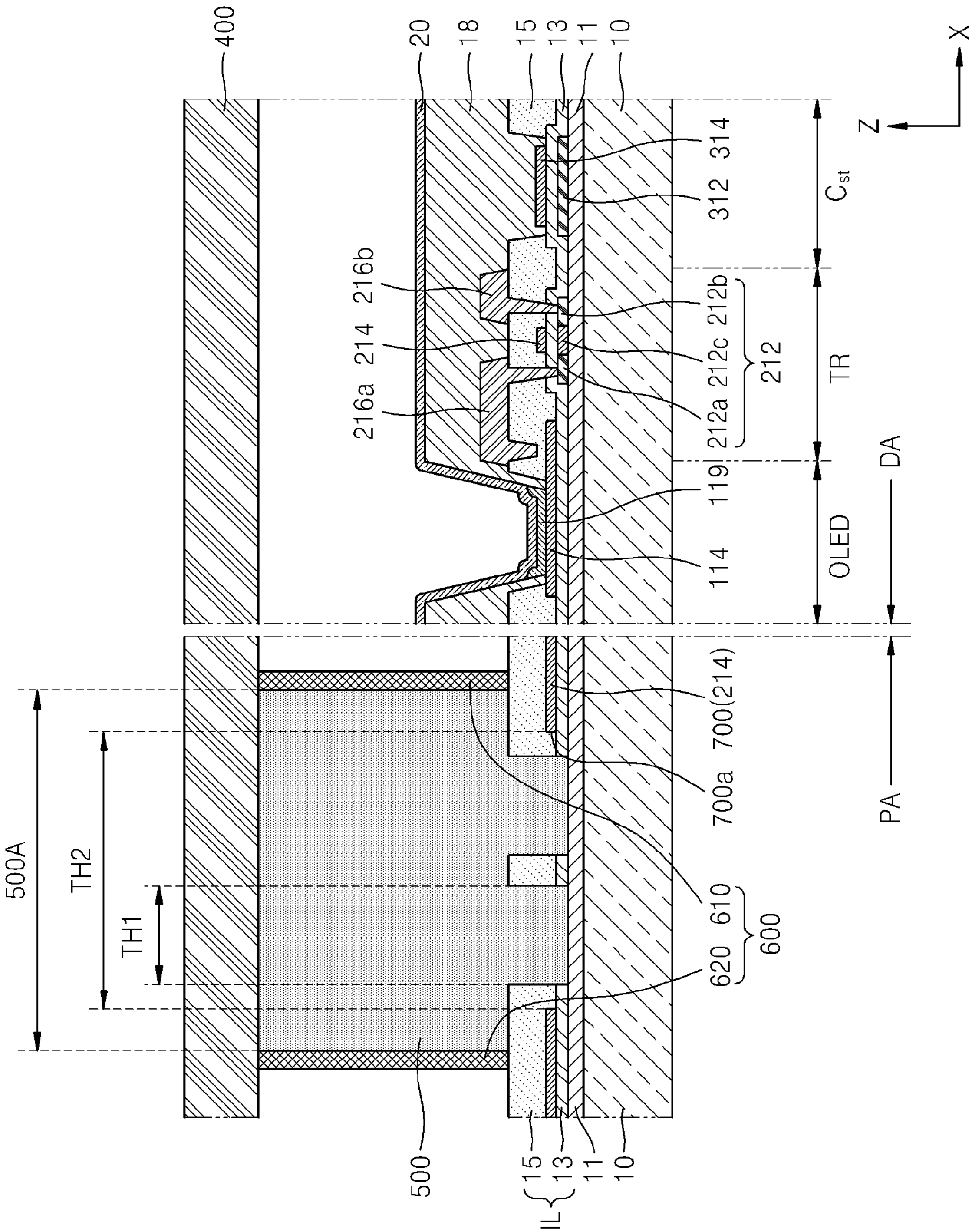
FIG. 4 is a cross-sectional view schematically illustrating a portion of an OLED display according to yet another embodiment.

FIG. 4 is a cross-sectional view schematically illustrating a part of an OLED display according to another embodiment. As shown in FIG. 4, the insulating layer IL only includes the gate insulating film 13 and the interlayer insulating layer 15, and the buffer layer 11 does not include a through hole. In this case, the buffer layer 11 is an additional insulating layer disposed between the first substrate 10 and the insulating layer IL.

As such, the insulating layer IL may be an extended portion of at least one of the buffer layer 11, the gate insulating film 13, or the interlayer insulating layer 15 which is extended into the peripheral area PA.

Certain embodiments of the OLED display according to the described technology have been described above, however, the described technology is not limited thereto. In other words, the scope of the described technology also includes a method of manufacturing an OLED display.

Figure 5:
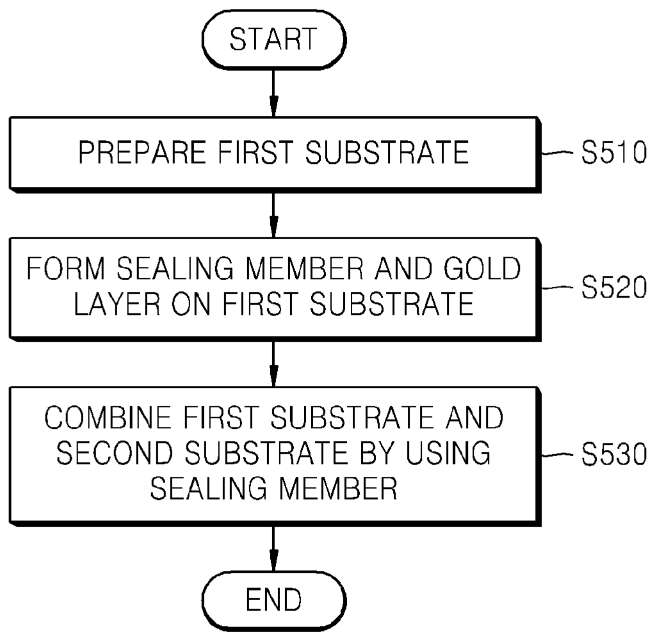
FIG. 5 is a flowchart illustrating a method of manufacturing an OLED display according to an embodiment.

FIG. 5 is a flowchart illustrating a method of manufacturing an OLED display according to an embodiment. First, in step S510, a first substrate 10 including a display area DA and a peripheral area PA surrounding the display area DA is prepared. While preparing the substrate 10, the insulating layer IL disposed throughout the display area DA and the peripheral area PA of the first substrate 10 and including at least one first through hole TH1 may be formed.

For example, the buffer layer 11, the gate insulating layer 13, and the interlayer insulating layer 15 may be formed throughout the display area DA and the peripheral area PA, and the OLED, the transistor TR, and the capacitor Cst may be formed in the display area DA.

Next, the at least one first through hole TH1 penetrating through the buffer layer 11, the gate insulating film 13, and the interlayer insulating layer 15 may be formed in the peripheral area PA. In this case, the insulating layer IL includes the buffer layer 11, the gate insulating film 13, and the interlayer insulating layer 15. Of course, the insulating layer IL may include at least one of the buffer layer 11, the gate insulating film 13, or the interlayer insulating layer 15, or as illustrated in FIG. 4, may not include the buffer layer 11.

When the gate electrode 214 is formed while forming the TFT, the metal layer 700 disposed in the peripheral area PA of the first substrate 10 and including the at least one second through hole TH2 may also be formed. The second through hole TH2 may be formed to include at least one first through hole TH1 corresponding to the second through hole TH2.

Then, in step S520, the sealing member 500 and the gold layer 600 may be disposed on the first substrate 10. The sealing member 500 is formed in the peripheral area PA surrounding the display area DA and may be formed by filing the first and second through holes TH1 and TH2. In addition, at least one of the first gold layer 610 contacting the sealing member 500 on the inner side of the sealing member 500 and the second gold layer 620 contacting the sealing member 500 on the outer side of the sealing member 500 may be formed.

Next, in step S530, the first and second substrates 10 and 400 may be attached to each with the sealing member 500. When the first and second substrates 10 and 400 are substantially aligned with each other and an UV light or a laser beam is irradiated on the second substrate 400, the sealing member 500 between the first and second substrates 10 and 400 is hardened. While the sealing member 500 is hardened, the gold layer 600 is also hardened and adhered to the sealing member 500. When the UV light or the laser beam is irradiated on the sealing member 500, the metal layer 700 overlapping the sealing member 500 on the first substrate 10 reflects the laser beam. Accordingly, the sealing member 500 is hardened by the laser beam irradiated from a top of the second substrate 400 and hardened by the laser beam reflected from the metal layer 700. Thus, the sealing member 500 may be strongly hardened. Moreover, since the gold layer 600 has high ductility, the gold layer 600 may further strongly adhered to the sealing member 500 when irradiated with the laser beam. Thus, the gold layer 600 blocks the sealing member 500 from the external environment, thereby preventing the sealing member 500 from oxidizing.

As described above, according to at least one embodiment, the dead space of an OLED display may be reduced. Also, two substrates of the OLED display may be attached to each other with only a small amount of sealing member. Also, oxidation or volatilization of the sealing member may be substantially prevented.

While one or more embodiments of the described technology have been described with reference to the figures, it will be understood by those of ordinary skill in the art that various changes in form and details may be made therein without departing from the spirit and scope of the present invention as defined by the following claims.

What is claimed is:

1. An organic light-emitting diode (OLED) display, comprising:
   a first substrate comprising a display area;
   a second substrate facing the first substrate;
   a sealing member surrounding the display area and attaching the first substrate to the second substrate; and
   a gold layer formed on the sealing member,
   wherein the cold layer extends from the first substrate to the second substrate such that the gold layer contacts both the first substrate and the second substrate.

2. The OLED display of claim 1, further comprising an insulating layer formed over the first substrate, wherein at least a portion of the sealing member is formed on the insulating layer and wherein the gold layer is formed on the insulating layer.

3. The OLED display of claim 1, wherein the width of the sealing member is about 680 μm.

4. The OLED display of claim 1, wherein the sealing member comprises glass frit.

5. The OLED display of claim 1, wherein the gold layer comprises at least one of a first gold layer formed on an inner side of the sealing member or a second gold layer formed on an outer side of the sealing member.

6. The OLED display of claim 1, wherein the first substrate further comprises a peripheral area surrounding the display area and an insulating layer formed over the first substrate and throughout the display area and the peripheral area, wherein the insulating layer defines at least one first through hole in the peripheral area.

7. The OLED display of claim 6, wherein the sealing member fills the first through hole.

8. The OLED display of claim 6, further comprising a buffer layer, a gate insulating film, and an interlayer insulating layer each formed over the first substrate, wherein the insulating layer comprises at least one of the buffer layer, the gate insulating film, or the interlayer insulating layer.

9. The OLED display of claim 6, further comprising a metal layer formed over the first substrate and defining at least one second through hole in the peripheral area.

10. The OLED display of claim 9, wherein the first through hole is formed within the area of the second through hole.

11. The OLED display of claim 10, wherein the sealing member fills each of the first and second through holes.

12. The OLED display of claim 9, wherein at least a portion of the insulating layer is formed between the metal layer and the sealing member.

13. The OLED display of claim 9, further comprising a transistor formed in the display area and comprising a gate electrode, wherein the metal layer is formed of the same material as the gate electrode.

14. The OLED display of claim 13, wherein the metal layer is formed on the same layer as the gate electrode.

15. The OLED display of claim 6, further comprising an additional insulating layer formed between the first substrate and the insulating layer.

16. A method of manufacturing an organic light-emitting diode (OLED) display, comprising:
   preparing a first substrate including a display area and a peripheral area surrounding the display area;
   forming a sealing member in the peripheral area of the first substrate;
   forming a gold layer on the sealing member; and
   attaching a second substrate to the first substrate with the sealing member, wherein the gold layer extends from the first substrate to the second substrate such that the gold layer contacts both the first substrate and the second substrate.

17. The method of claim 16, wherein the gold layer is formed on at least one of an inner side or an outer side of the sealing member.

18. The method of claim 16, further comprising:

forming an insulating layer over the first substrate throughout the display area and the peripheral area; and forming at least one first through hole in the insulating layer in the peripheral area, wherein the forming of the sealing member comprises filling the sealing member in the first through hole.

19. The method of claim 18, wherein the gold layer is formed over the insulating layer.

20. The method of claim 18, further comprising:

forming a metal layer over the first substrate; and forming at least one second through hole in the metal layer in the peripheral area.

21. The OLED display of claim 1, wherein the gold layer comprises a pair of gold layers formed on opposing sides of the sealing member.

22. The OLED display of claim 1, wherein the gold layer blocks the sealing member from being exposed to the environment.

* * * * *